(12) United States Patent
Yoshizawa et al.

(10) Patent No.: US 6,351,163 B1
(45) Date of Patent: Feb. 26, 2002

(54) RESET CIRCUIT

(75) Inventors: Hirokazu Yoshizawa; Masanao Hamaguchi, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/561,580

(22) Filed: Apr. 28, 2000

(30) Foreign Application Priority Data

Apr. 28, 1999 (JP) ............................................. 11-121121
Apr. 27, 2000 (JP) ........................................ 2000-127326

(51) Int. Cl.[7] ................................................. H03L 7/00
(52) U.S. Cl. ........................ 327/142; 327/198; 327/544
(58) Field of Search ................................ 327/142, 198, 327/544; 326/66, 69, 73, 74

(56) References Cited

U.S. PATENT DOCUMENTS

| | | | | |
|---|---|---|---|---|
| 4,890,019 A | * | 12/1989 | Hoyte et al. | 307/475 |
| 4,920,284 A | * | 4/1990 | Denda | 307/475 |
| 5,034,635 A | * | 7/1991 | Ten Eyck | 307/475 |
| 5,561,388 A | * | 10/1996 | Kumagai | 326/66 |
| 5,936,428 A | * | 8/1999 | Merritt | 326/81 |

* cited by examiner

*Primary Examiner*—Jung Ho Kim
(74) *Attorney, Agent, or Firm*—Adam & Wilks

(57) ABSTRACT

A reset circuit includes an invertor having one control input terminal to which a positive supply voltage and a potential lower than GND are supplied, and an n-channel transistor having a gate terminal connected to an output terminal of the invertor, a source terminal connected to a potential lower than the GND and a drain terminal connected to the GND.

13 Claims, 16 Drawing Sheets

RESET CIRCUIT

BACKGROUND OF THE INVENTION

1. Field of the Invention

The present invention relates to a reset circuit that shortcircuits an output voltage terminal of a power IC to a GND level in a standby mode in the case where the power IC which generates a voltage lower than VSS has the standby mode where the operation of an internal circuit stops in order to reduce power consumption.

2. Description of the Related Art

In general, positive and negative bias power supplies are required in order to drive a liquid crystal display panel (hereinafter referred to as "LCD panel"). In the case where the LCD panel is mounted on a portable equipment, a power IC such as a switching regulator or a charge pump circuit is used in order to boost a voltage of a battery to a voltage required for the LCD panel or to develop a reverse voltage. Then, in order to elongate the operating lifetime of the battery mounted on the portable equipment, a demand is made in which the power IC is provided with a standby mode where the operation of the internal circuit is completely stopped when display of the LCD is not necessary.

In this situation, when the internal circuit of the power IC stops to operate, charges remaining in a capacitor connected to an output terminal of the power IC are reduced due to leakage, to thereby gently reduce the output voltage. However, when the output voltage of the power IC remains for a long period of time, there arises such a problem that an excessive load is given to the LCD panel, which is not preferable in reliability.

Under the above circumstance, as means for solving the above problem, there has been proposed a method in which a MOS switch is connected between the output terminal and the GND, and the MOS switch is turned on to shortcircuit the output terminal to the GND level, to thereby discharge the residual charges in the capacitor in a short period of time.

In the case where the output voltage of the power IC is lower than a supply voltage VSS which is a lower one of two supply voltages of the IC, the MOS switch cannot be realized on the IC. The reason is that if the MOS switch is going to be realized by an n-channel transistor, because a parasitic p-n junction diode always turns on in a p-type substrate of the VSS level and an n⁺ region lower in potential than VSS, the output voltage of the power IC is fixed to a voltage lower than the VSS level by the forward on-state voltage of the diode.

On the other hand, if the MOS switch is going to be realized by a p-channel transistor, when the gate voltage of the p-channel transistor is controlled by the level of two supply voltages VDD and VSS of the IC, the p-channel transistor always turns off without the gate voltage being smaller than the source voltage (VSS level).

Also, even if an external n-channel transistor is used, if two supply voltages VDD and VSS of the IC are used to control the gate voltage of the transistor, the transistor always turns on with the result that the on/off operation cannot be controlled.

On the other hand, even if an external p-channel transistor is used, if two supply voltages VDD and VSS of the IC are used to control the gate voltage of the transistor, the transistor always turns off with the result that the on/off operation cannot be controlled.

As described above, there arises such a problem that the on/off operation of the MOS switch cannot be controlled, in the standby mode in which the power IC that generates a voltage lower than VSS stops the operation of the internal circuit, the MOS switch is used to shortcircuit the output voltage terminal of the power IC to the GND level, and two supply voltages VDD and VSS are used to control the gate voltage of the MOS switch.

SUMMARY OF THE INVENTION

The present invention has been made to solve the above problem, and therefore an object of the present invention is to provide a reset circuit which is simple in circuit structure and is capable of reducing the costs.

Another object of the present invention is to provide a reset circuit which is capable of suppressing a current consumption to a minimum.

Still another object of the present invention is to provide a reset circuit which is capable of surely controlling the on/off operation of the MOS switch.

In order to achieve the above objects, according to the present invention, there is provided a reset circuit structured such that an invertor including one p-channel transistor which is an external part, one n-channel transistor which is an external part and one resistor which is an external part is operated by a positive supply voltage (VDD) and a negative voltage generated by a reverse switching regulator.

Also, according to the present invention, there is provided a reset circuit in which a current is only the though-current that flows through the invertor as soon as the mode is switched over.

Also, according to the present invention, there is provided a reset circuit in which a MOS switch is controlled by a comparator circuit and a reference voltage to shortcircuit the negative output voltage terminal of the power IC to the GND level. In the reset circuit thus structured, the negative supply voltage of the comparator circuit is applied from the negative output voltage of the power IC whereby the amplitude of the output voltage of the comparator circuit is expanded from VDD to the level of the negative output voltage of the power IC.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings. In the following description, it is assumed that a supply voltage VSS are equal in potential to GND.

Figure 1A:
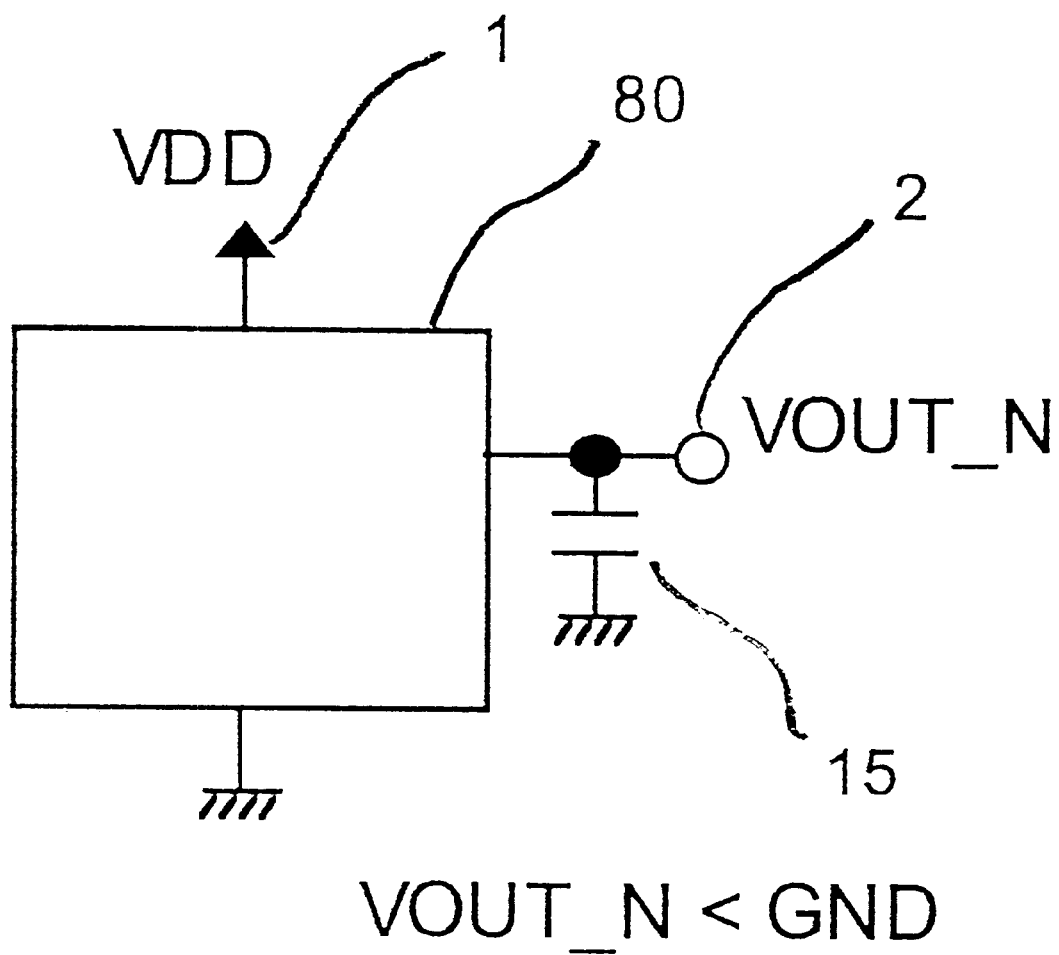
FIGS. 1A and 1B are diagrams showing the structure of a reset circuit in accordance with the present invention.

FIG. 1A shows a power IC that generates a voltage lower than VSS. A terminal 2 (VOUT_N) is an output terminal of the power IC which generates a voltage lower than VSS.

Figure 1B:
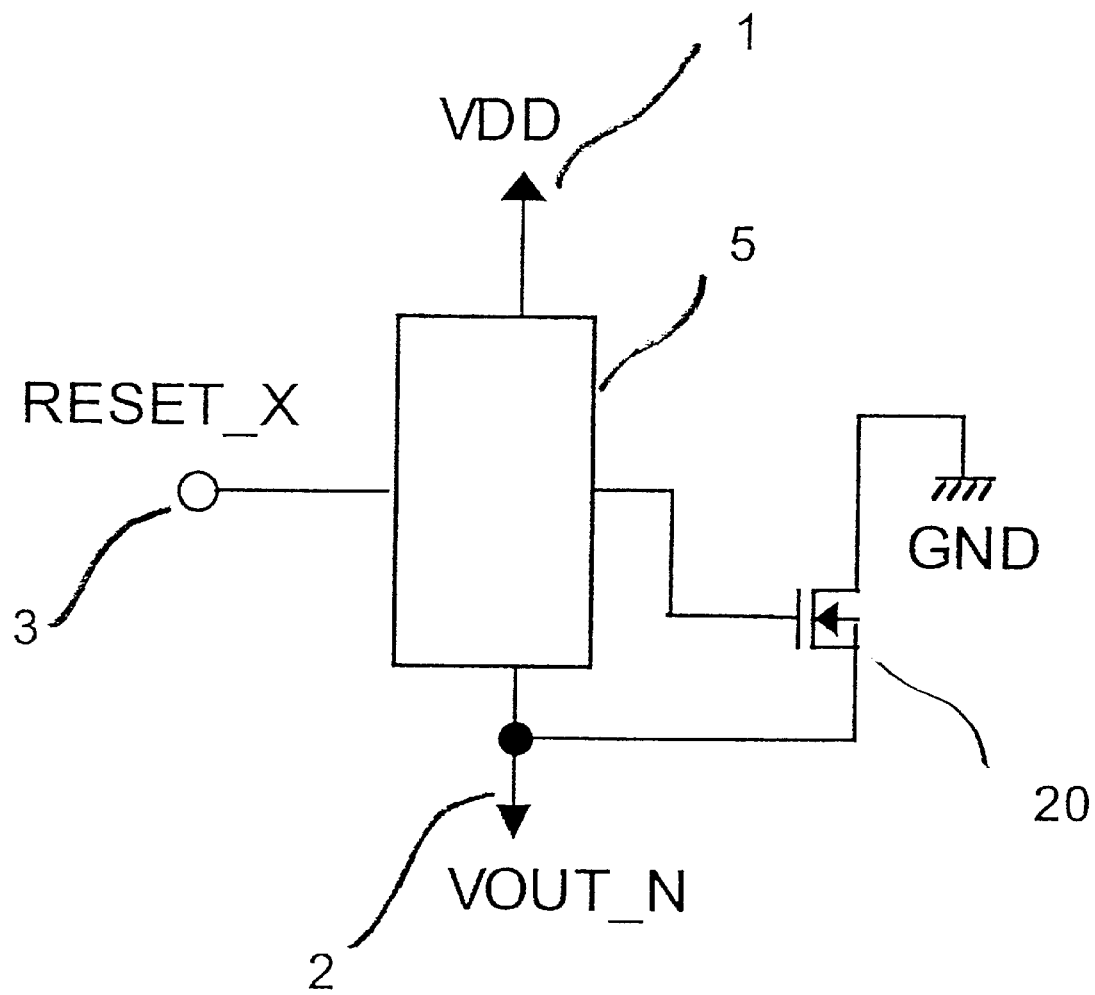

FIG. 1B is a diagram showing an example of the structure of a reset circuit in accordance with the present invention. VDD identical with the positive supply voltage of the power IC is used as the positive supply voltage of the invertor 5 and the output voltage VOUT_N of the power IC is used as the negative supply voltage of the invertor 5. It should be noted that VOUT_N is a potential lower than the negative supply voltage VSS of the power IC.

When a reset control signal 3 (RESET_X) is supplied to an input terminal of the invertor 5, the invertor 5 outputs a voltage corresponding to HIGH or LOW in response to the level of the reset control signal 3 which is then supplied to a gate terminal of an n-channel transistor 20. It is assumed that the levels of HIGH and LOW of the reset control signal 3 are equal to the supply voltages VDD and VSS of the power IC, respectively.

When the reset control signal 3 is HIGH, that is, VDD, the output of the invertor 5 becomes VOUT_N and the transistor 20 becomes in an off-state, resulting in an open state between VOUT_N and GND. On the other hand, when the reset control signal 3 is LOW, that is, VSS, the output of the invertor 5 becomes VDD and the transistor 20 becomes in an on-state, as a result of which VOUT_N and GND are shortcircuited. Then, charges remaining in a capacitor 15 connected to the output terminal 2 of the power IC are discharged, and VOUT_N becomes equal to the GND level.

Figure 2:
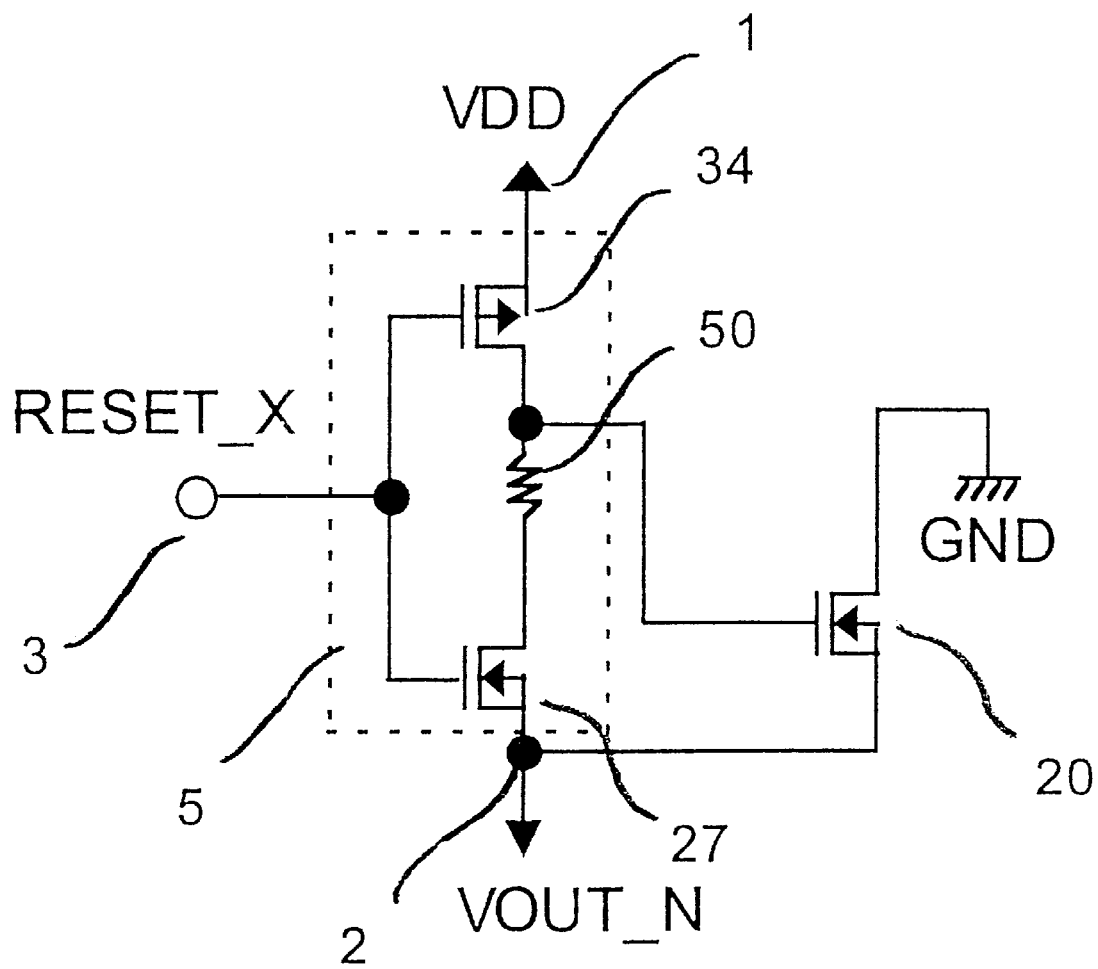
FIG. 2 is a diagram showing an example of the structure of an invertor used in the reset circuit of the present invention and the reset circuit.

A circuit in which the invertor 5 is made up of transistors and a resistor is shown in FIG. 2. When the reset control signal 3 is HIGH, that is, VDD, a p-channel transistor 34 becomes off and an n-channel transistor 27 becomes on with the result that the output of the invertor 5 becomes VOUT_N. Then, since no potential difference exists between the gate and the source of the n-channel transistor 20, the n-channel transistor 20 becomes in the off-state and the open state is made between VOUT_N and GND. When the reset control signal 3 is LOW, that is, VSS, both of the p-channel transistor 34 and the n-channel transistor 27 become on.

Since a resistor 50 is disposed between two transistors and a voltage drop occurs between both ends of the resistor 50, the output of the invertor 5 becomes a value relatively close to VDD.

In this situation, assuming that the threshold voltage of the n-channel transistor 20 is VTN, if the output voltage of the invertor 5 is GND+VTN or more, the transistor 20 becomes in the on-state, and VOUT_N and GND are shortcircuited whereby VOUT_N becomes equal to the GND level.

The output voltage of the invertor 5 is represented as follows:

$$V=(R+RON\_n)/(RON\_p+R+RON\_n)*(VDD-VOUT\_N)+VOUT\_N$$

where R is a resistance of the resistor 50, RON_n and RON_p are on-resistances of the n-channel transistor 27 and the p-channel transistor 34, respectively, and VOUT_N is the output voltage 2 of the power IC before the n-channel transistor 20 turns on. In order that VOUT_N is reset to the GND level by turning on the n-channel transistor 20, assuming that the voltage V is equal to GND+VTN, R, RON_n and RON_p need to be selected so as to satisfy the following condition:

R'>(VTN−VOUT_N)/(VDD−VOUT_N)

where R' is (R+RON_n)/(RON_p+R+RON_n).

If VOUT_N is reset to GND, since a potential between the gate and the source of the n-channel transistor 27 becomes 0 V, the n-channel transistor 27 turns off. Accordingly, there is no case in which a through-current flows through the p-channel transistor 34 and the n-channel transistor 27.

Figure 3:
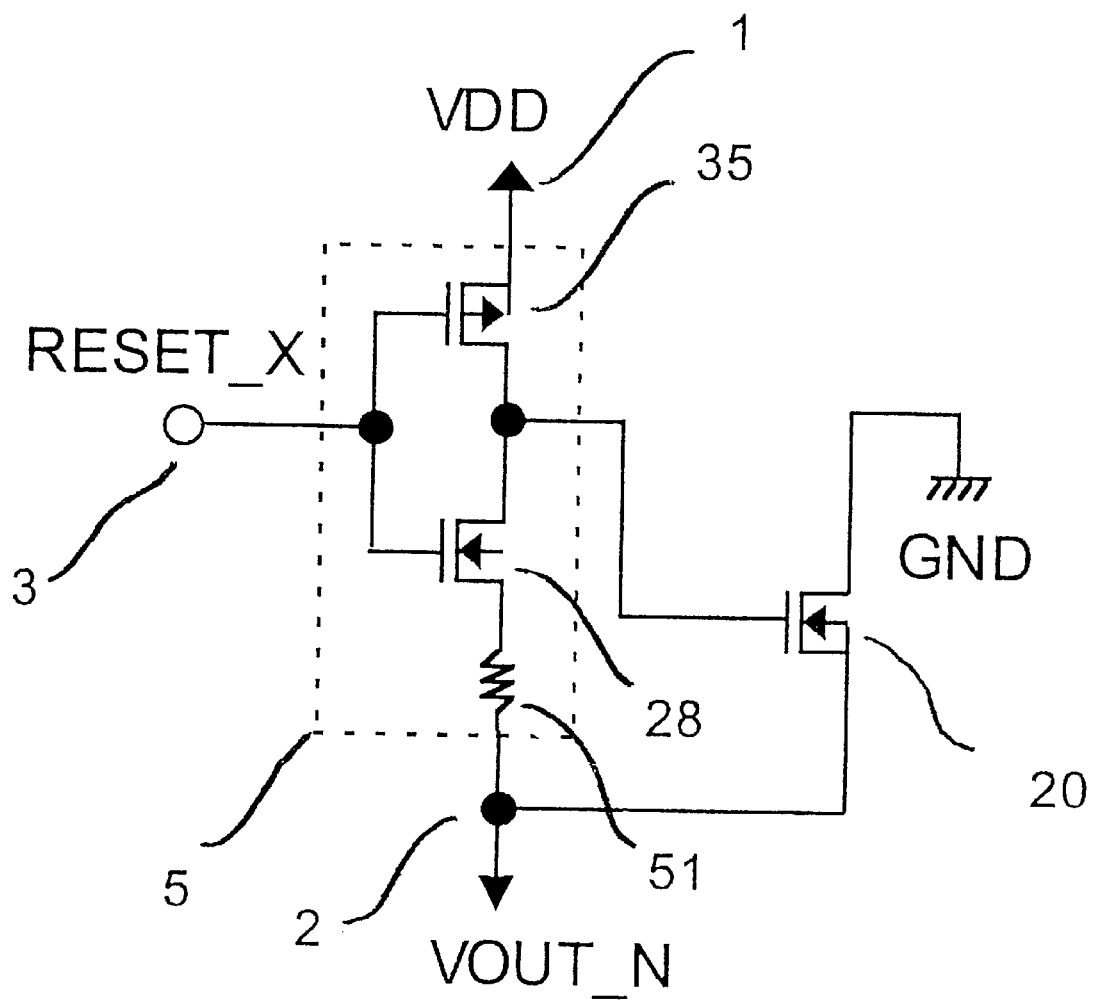
FIG. 3 is a diagram showing another example of the structure of an invertor used in the reset circuit of the present invention and the reset circuit.

The circuit of FIG. 1 can be realized by a circuit shown in FIG. 3. Similarly, the same operation as that in the circuit of FIG. 2 is conducted.

When the reset control signal 3 is VDD, because the p-channel transistor 35 becomes off and the n-channel transistor 28 becomes on, the output of the invertor 5 becomes VOUT_N. Then, since no potential difference exists between the gate and the source of the n-channel transistor 20, the n-channel transistor 20 becomes in the off-state and the open state is made between VOUT_N and GND. When the reset control signal 3 is VSS, both of the p-channel transistor 35 and the n-channel transistor 28 become on. Since a resistor 51 is disposed between the n-channel transistor 28 and VOUT_N and voltage drop occurs between both ends of the resistor 51, the output of the invertor 5 becomes a value relatively close to VDD.

In this situation, if the output voltage of the invertor 5 is GND+VTN or more, the transistor 20 becomes in the on-state, and VOUT_N and GND are shortcircuited whereby VOUT_N becomes equal to the GND level. The output voltage of the invertor 5 is represented as follows, as in the circuit shown in FIG. 2:

$$V=(R+RON\_N)/(RON\_p+R+RON\_n)*(VDD-VOU\_n)+VOUT\_N$$

Accordingly, in order that VOUT_N is reset to the GND level by turning on the n-channel transistor 20, R, RON_n and RON_p need to be selected so as to satisfy the following condition: R'>(VTN−VOUT_N)/(VDD−VOUT_N) However, unlike to the circuit shown in FIG. 2, since the voltage between the gate and the source of the n-channel transistor 28 becomes as small as the voltage drop of the resistor 51, if the p-channel transistors 34 and 35 and the n-channel transistors 27 and 28 are equal in size to each other, respectively, and the values of the resistors 50 and 51 are equal to each other, the on-resistance of the n-channel transistor 28 is larger than that of the n-channel transistor 27, and the output voltage of the invertor 5 shown in FIG. 3 can be made higher than that of FIG. 2.

Similarly, if VOUT_N becomes equal to GND, since the potential between the gate and the source of the n-channel transistor 28 becomes 0 V, there is no case in which a through-current flows through the p-channel transistor 35 and the n-channel transistor 28.

Figure 6:
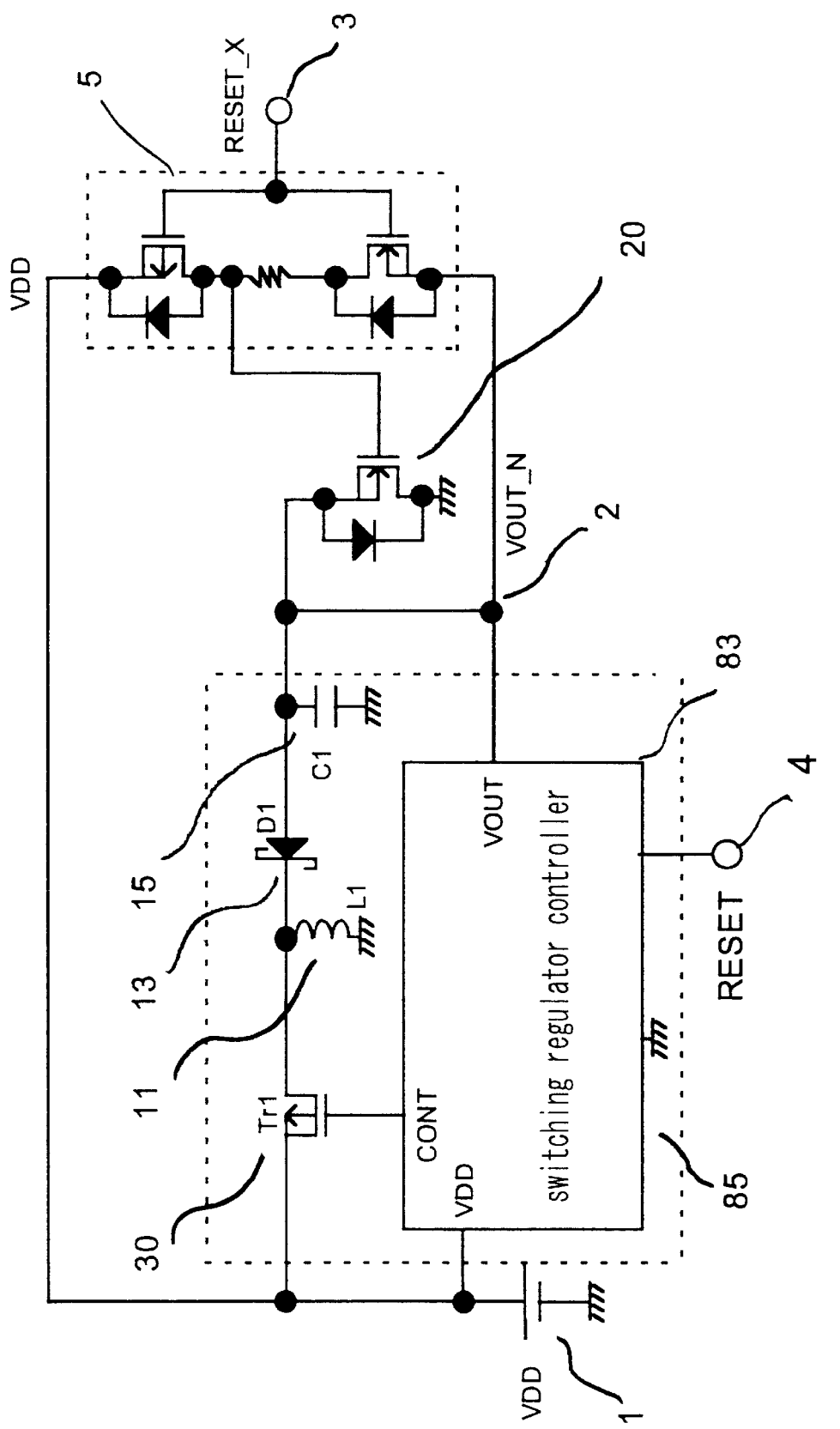
FIG. 6 is a diagram showing the structure of a reverse switching regulator using the reset circuit of the present invention.

FIG. 6 is a diagram showing the structure of a reverse switching regulator using the reset circuit of the present invention. There has been known the PFM system shown in FIG. 11 and the PWM system shown in FIG. 12 as a method of realizing the switching controller.

Figure 11:
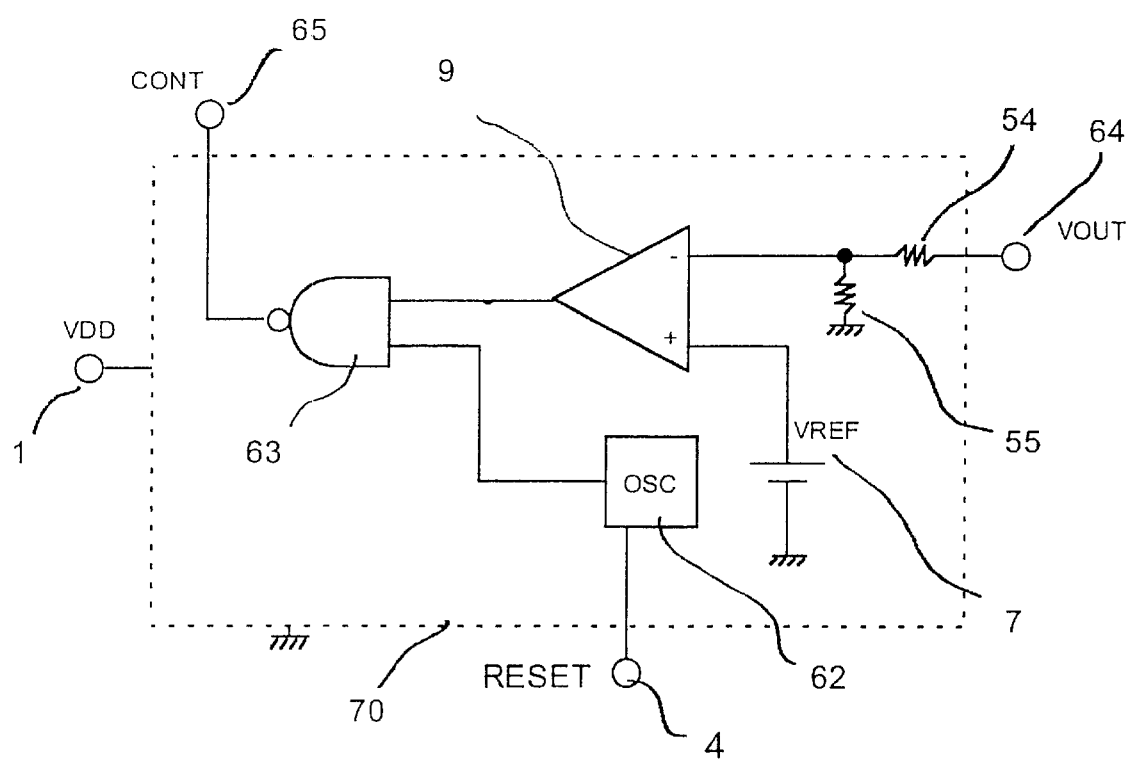
FIG. 11 is a diagram showing the structure of a reverse switching regulator controller of PFM control.

In the PFM system, an output 2 (VOUT_N) of the switching regulator in FIG. 6 is divided by two resistors 54 and 55 shown in FIG. 11 and then compared with a reference voltage 7 by using a comparator 9. If the voltage divided by the resistors 54 and 55 is smaller than the reference voltage 7, the output of the comparator 9 becomes HIGH level, and the output of an oscillating circuit 62 is transmitted to a driver control terminal 65. If the voltage divided by the resistors 54 and 55 is larger than the reference voltage 7, the output of the comparator 9 becomes LOW level, to thereby maintain the driver control terminal 65 HIGH.

As described above, in the PFM system, the output voltage is held to a desired value by changing the oscillating frequency. In the standby mode, in order to stop the oscillation of the switching regulator, the output of the oscillating circuit 62 is fixed to the LOW level using the reset terminal. With this operation, the driver control terminal 65 becomes HIGH level, and the p-channel transistor 30 becomes in the off-state in FIG. 6.

Figure 12:
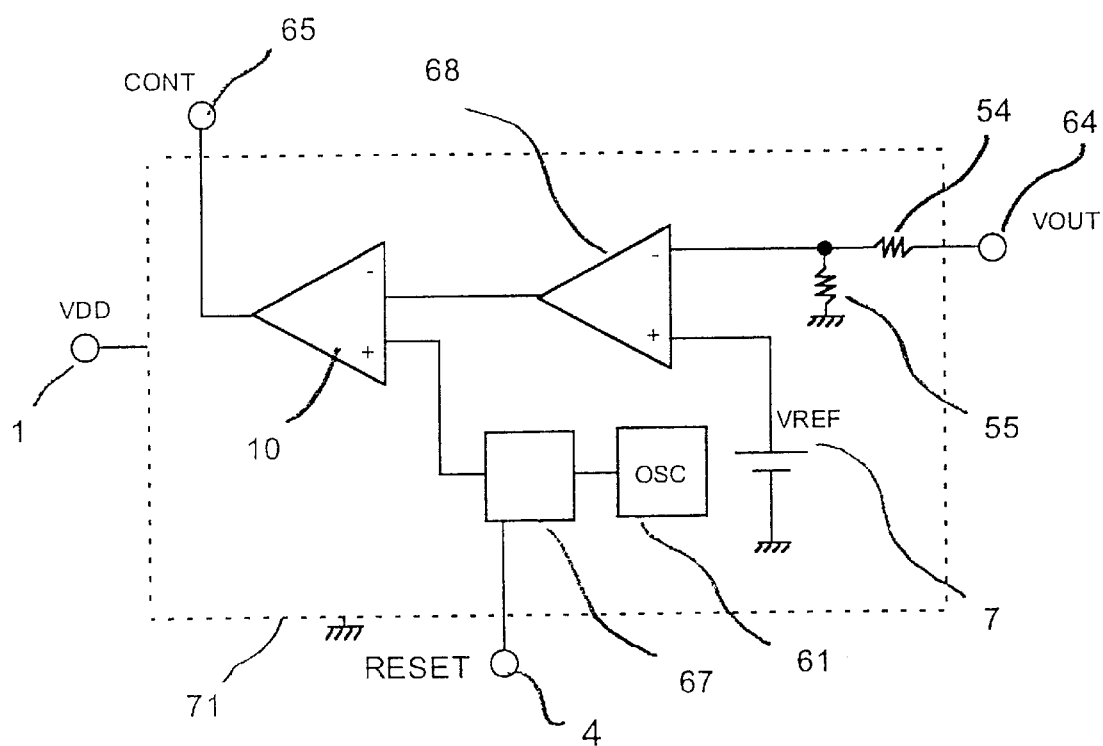
FIG. 12 is a diagram showing the structure of a reverse switching regulator controller of PWM control.

On the other hand, in the PWM system, after an output 2 (VOUT_N) of the switching regulator in FIG. 6 is divided by two resistors 54 and 55 shown in FIG. 12, a difference between a reference voltage 7 and the voltage divided by the resistors 54 and 55 is amplified by an amplifier 68 and then inputted to a post-stage comparator 10. An output of a chopping wave generating circuit 67 is inputted to another input terminal of the comparator 10. As a result, the voltage waveform of the driver control terminal 65 is held constant in frequency, and its pulse width (DUTY) is changed.

Figure 8:
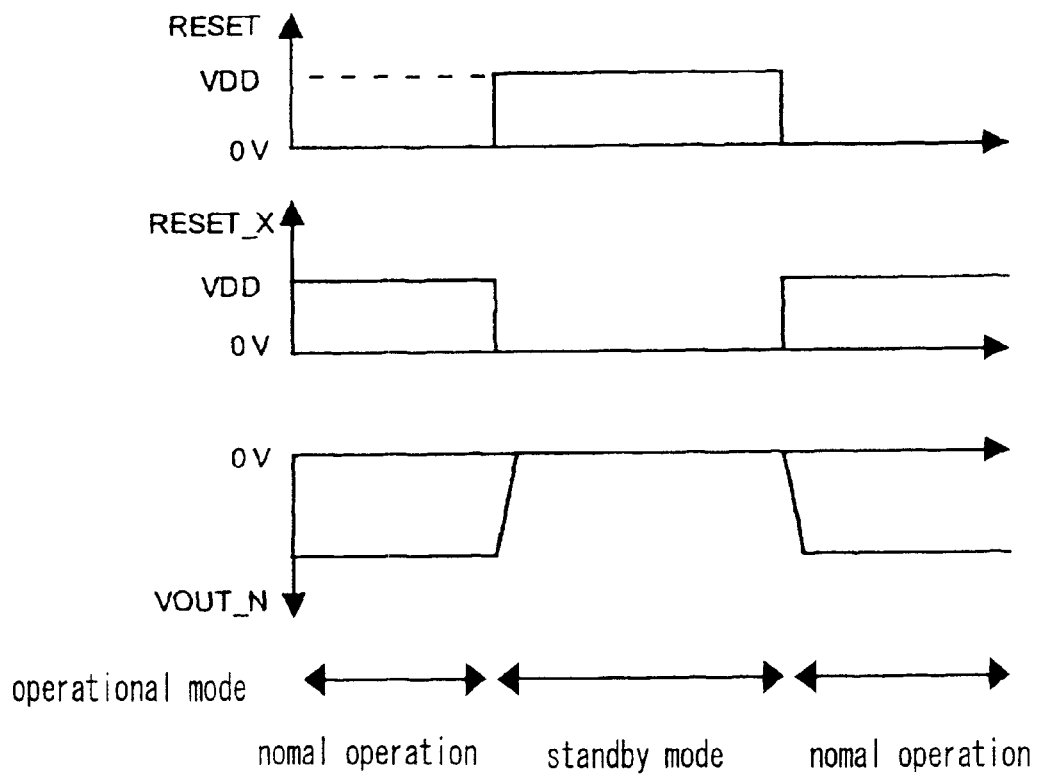
FIG. 8 shows timing charts of a reset control signal and the output voltage of the reverse switching regulator respectively.

In the standby mode, in order to stop the oscillation of the switching regulator, the output of a chopping wave generating circuit 67 is fixed to the HIGH level using the reset terminal. With this operation, the driver control terminal 65 becomes HIGH level, that is, VDD, and the p-channel transistor 30 becomes in the off-state in FIG. 6. A timing chart of the reset control signals 3, 4 (RESET_X, RESET) and the output terminal 2 (VOUT_N) of the power IC is shown in FIG. 8.

Figure 9:
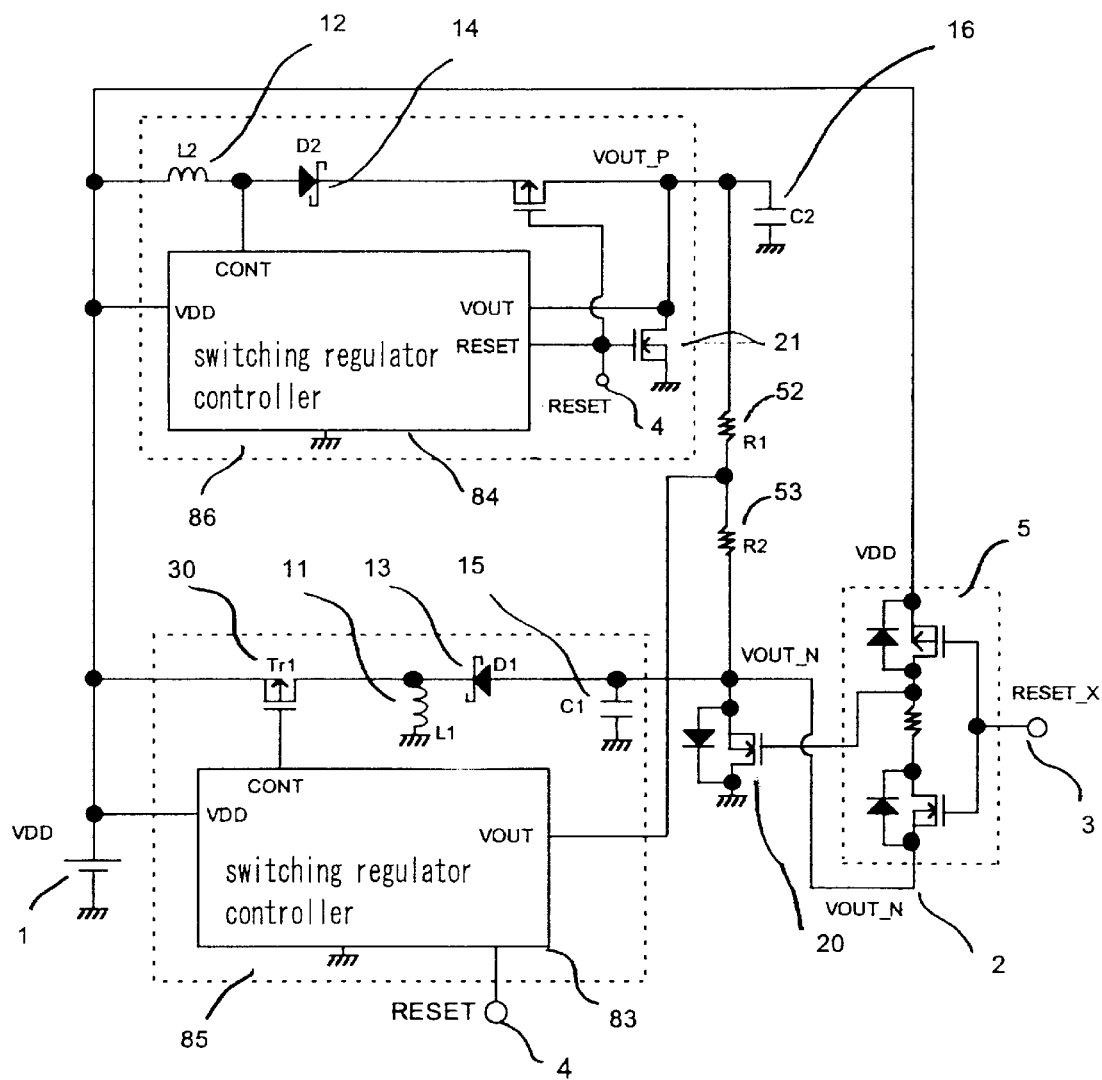
FIG. 9 is a diagram showing the structure of a reverse switching regulator using the reset circuit of the present invention.

A circuit in which the step-up switching regulator 86 and the reverse switching regulator 85 are integrated together is shown in FIG. 9. An LCD panel requires two supply voltages the absolute values of which are symmetrically equal to each other with a given reference voltage as the center, and the circuit shown in FIG. 9 is adapted to satisfy such requirement. In FIGS. 11 and 12, the switching regulator controller 83 shortcircuits the resistor 54 and opens the resistor 55.

If the resistances of the resistors 52 and 53 are selected to the same value, the absolute value of the output voltage VOUT_P of the step-up switching regulator 86 and the absolute value of the output voltage VOUT_N of the reverse switching regulator 85 becomes symmetrically equal to each other with respect to a reference voltage VREF of the switching regulator controller 70 shown in FIG. 11. For example, if the reference voltage VREF of the switching regulator controller 70 is made equal to GND, VOUT_P= VOUT_N is satisfied.

Figure 10:
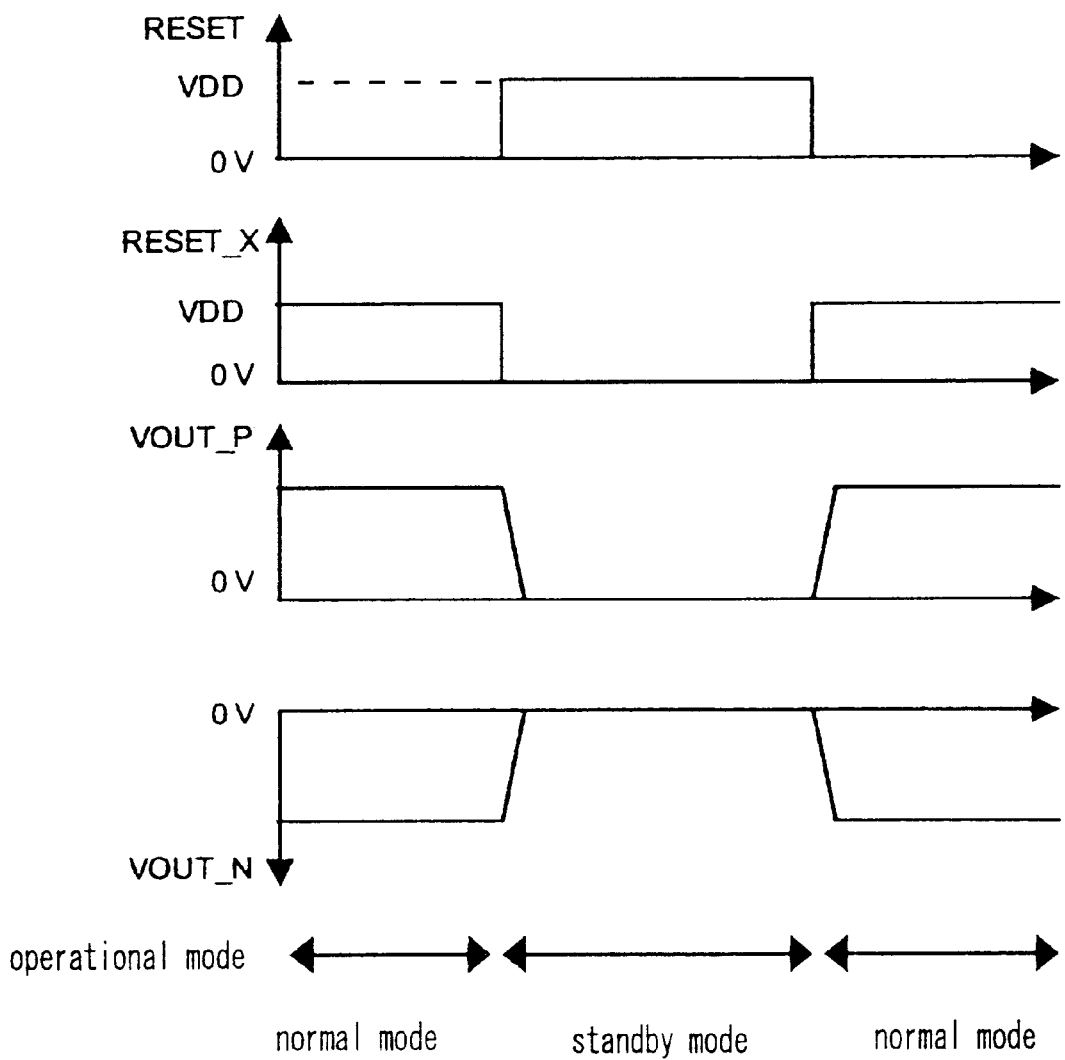
FIG. 10 shows timing charts of the reset control signal, the output voltage of the step-up switching regulator and the output voltage of the reverse switching regulator, respectively.
Figure 13:
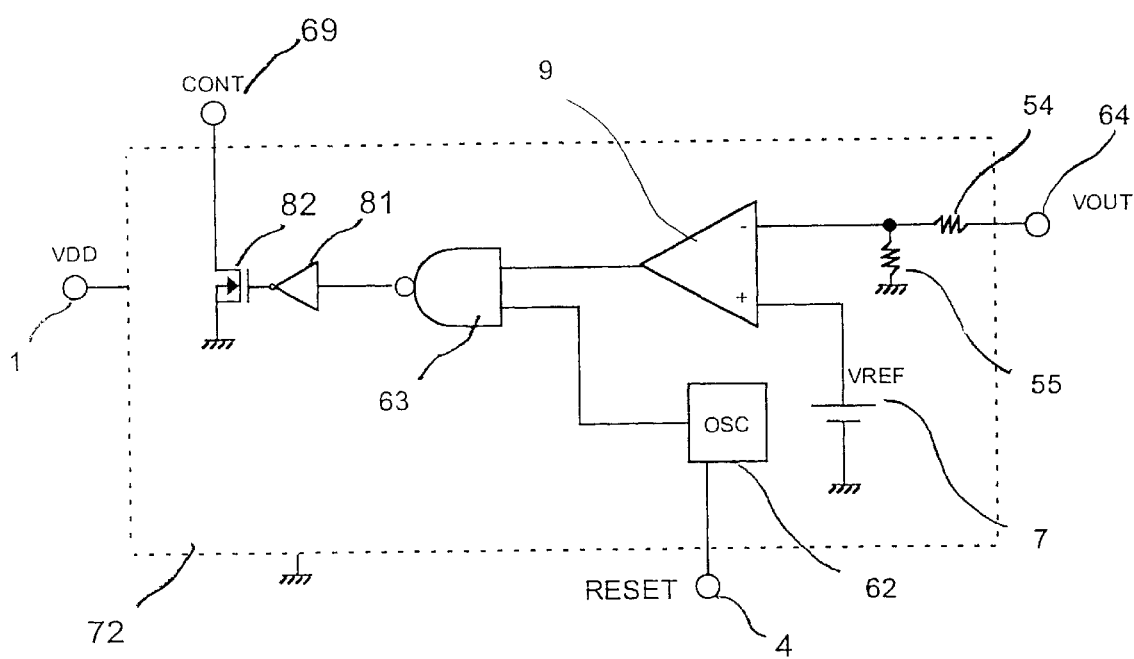
FIG. 13 is a diagram showing the structure of a step-up switching regulator controller of PFM control.
Figure 14:
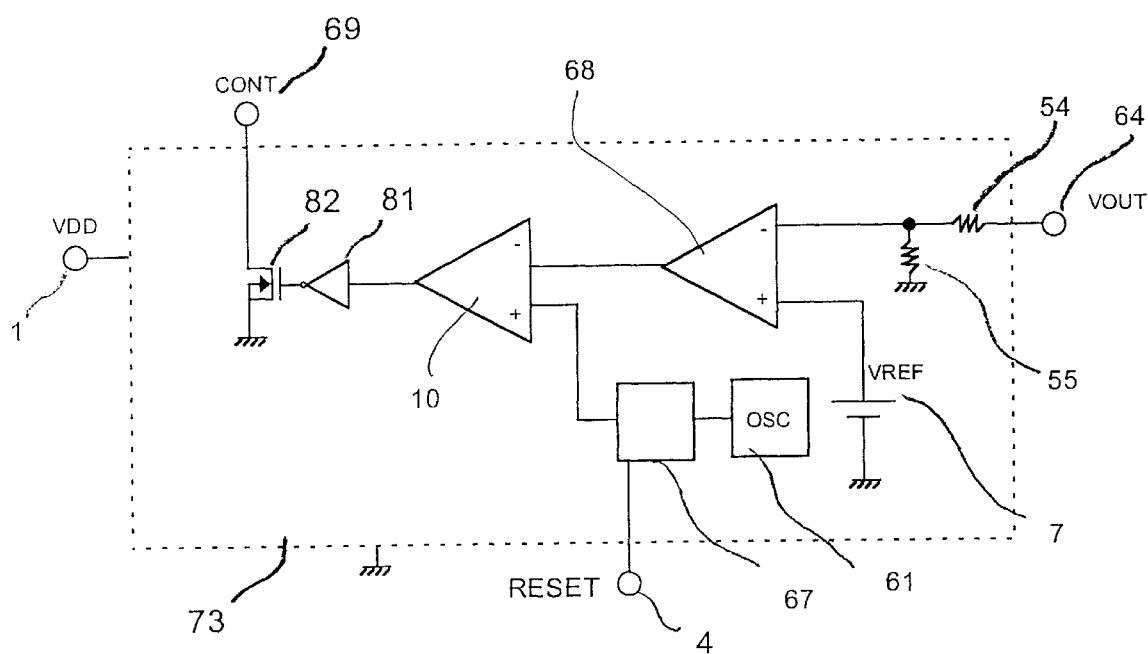
FIG. 14 is a diagram showing the structure of a step-up switching regulator controller of PWM control.

A timing chart of the reset control signals 3, 4 (RESET_X, RESET) shown in FIG. 9, the output terminal 2 (VOUT_N) of the power IC and the output voltage VOUT_P of the step-up switching regulator 86 is shown in FIG. 10. An example of a method of realizing the step-up switching regulator controller 84 is shown in FIG. 13 (PFM system) and FIG. 14 (PWM system). The operation is identical with that of the circuits shown in FIGS. 11 and 12.

Figure 4:
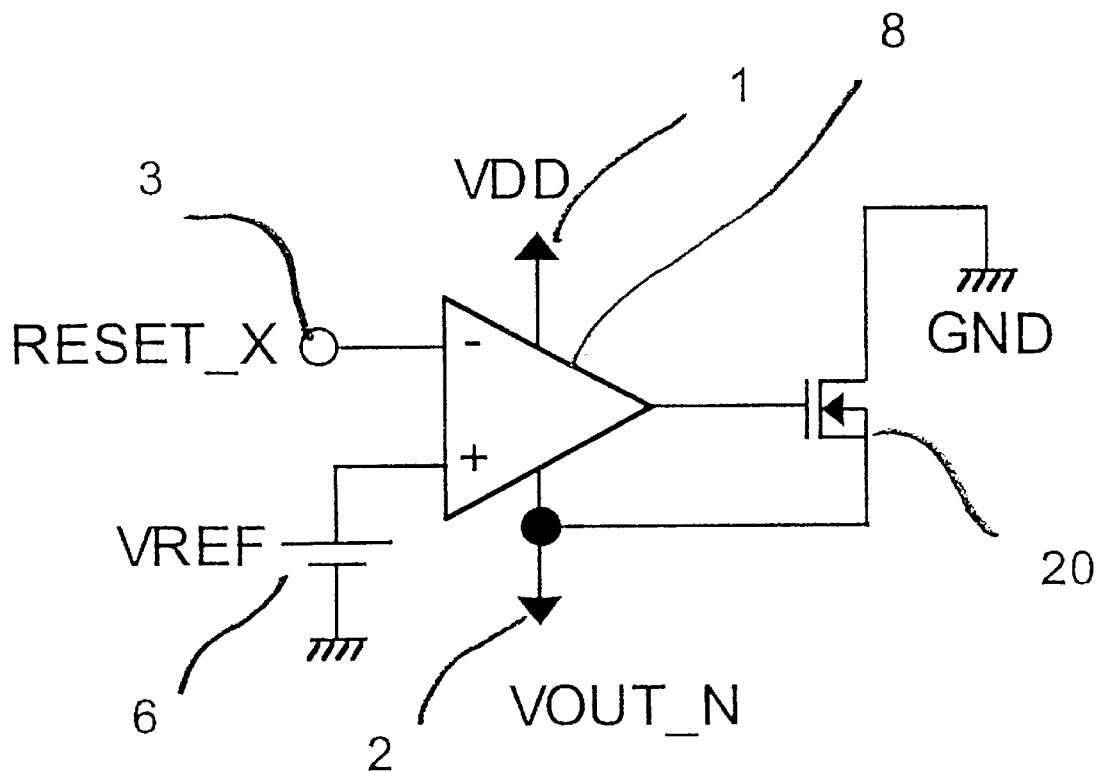
FIG. 4 is a diagram showing the structure of a conventional reset circuit.
Figure 5:
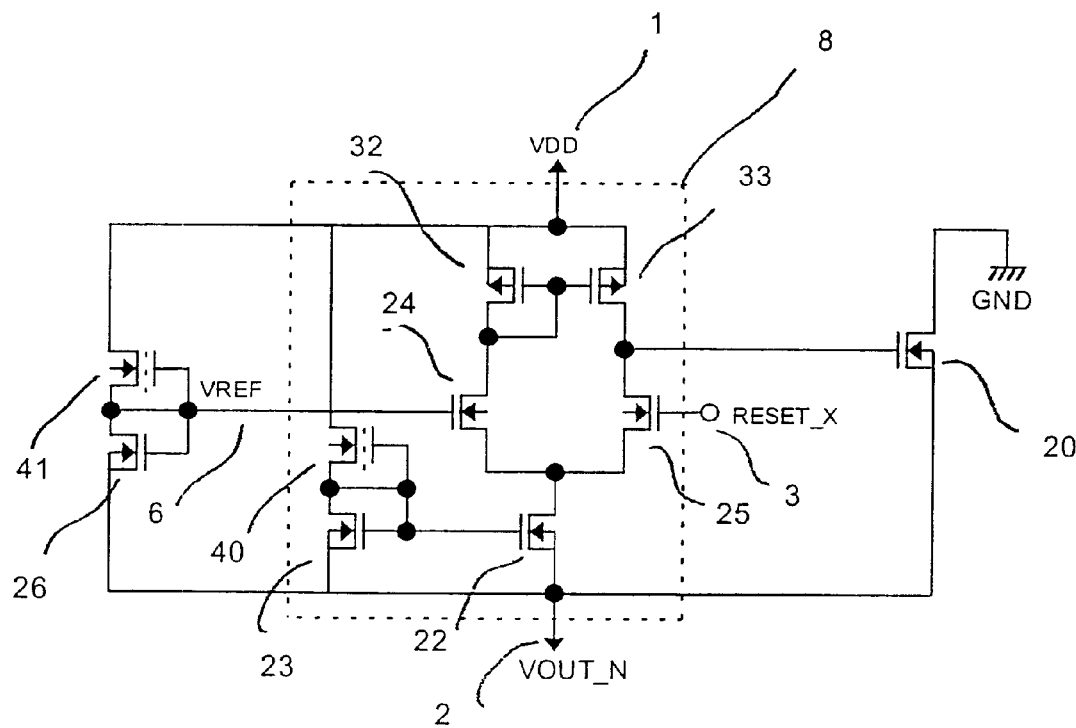
FIG. 5 is a diagram showing an example of the structure of a conventional reset circuit.

In order to shortcircuit the output voltage terminal of the reverse switching regulator to the GND level, an example of the circuit structure of the reset circuit using the comparator circuit and the reference voltage is shown in FIG. 4. Also, FIG. 5 shows an example of the circuit structure of a reset circuit using an example of the structure of the comparator and the reference voltage generating circuit. Also, FIG. 7 shows an example of the structure of a reverse switching regulator using the reset circuit.

Figure 7:
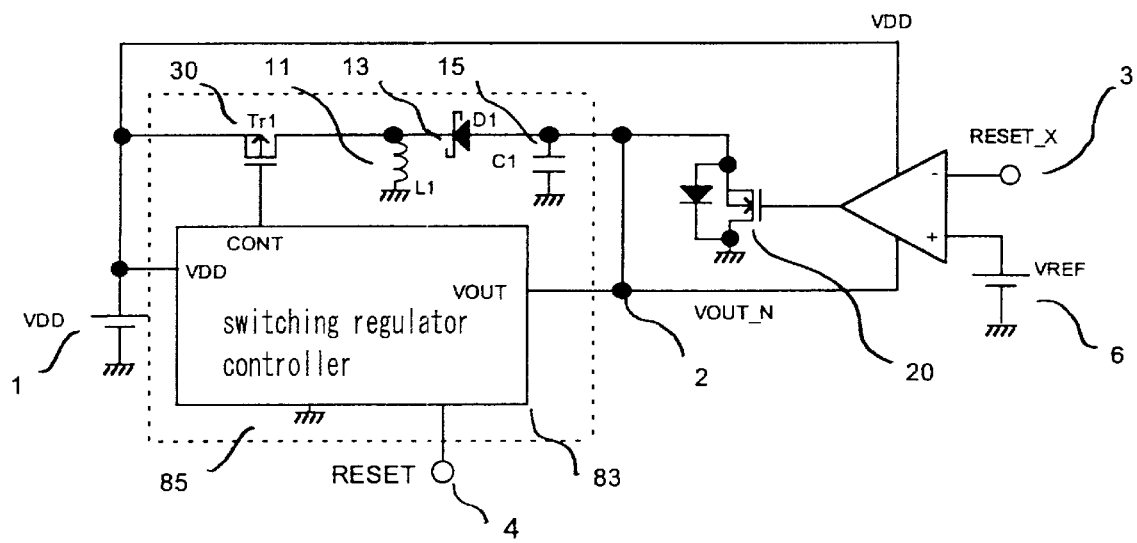
FIG. 7 is a diagram showing the structure of a reverse switching regulator using the conventional reset circuit.

In FIG. 7, it is assumed that the reset control signal RESET_X inputted to the reverse input terminal is a voltage equal to the positive supply voltage VDD in the normal operating state. On the other hand, it is assumed that the reset control signal RESET_X is equal to GND=0 V in the standby mode.

A reference voltage VREF is inputted to the nonreverse input terminal. VREF is an intermediate value of the supply voltage VDD and the GND level, which is, for example, a voltage corresponding to VDD/2. In this situation, the comparator outputs a LOW level in logic. Because the negative power supply of the comparator is VOUT_N, the output of the comparator becomes VOUT_N and is inputted to the gate of the n-channel transistor 20. Because the source of the transistor is VOUT_N and no potential difference occurs between the gate and the source of the transistor 20, the n-channel transistor 20 is off.

Subsequently, the operation in the standby state will be considered. The reset control signal RESET_X is set to the same level as GND. In this situation, the comparator outputs the HIGH level in logic. Because the positive power supply of the comparator is VDD, the output of the comparator becomes VDD and is then inputted to the gate of the n-channel transistor 20. Because the source of the n-channel transistor 20 is VOUT_N and a potential difference equal to or more than a threshold value of the transistor occurs between the gate and the source, the transistor turns on. (In the standby state, it is assumed that the gate voltage of the p-channel transistor 30 is HIGH level, and the p-channel transistor 30 is off.) In this situation, charges stored in the capacitor 15 are discharged through the n-channel transistor 20, and VOUT_N is 0 V.

Figure 15:
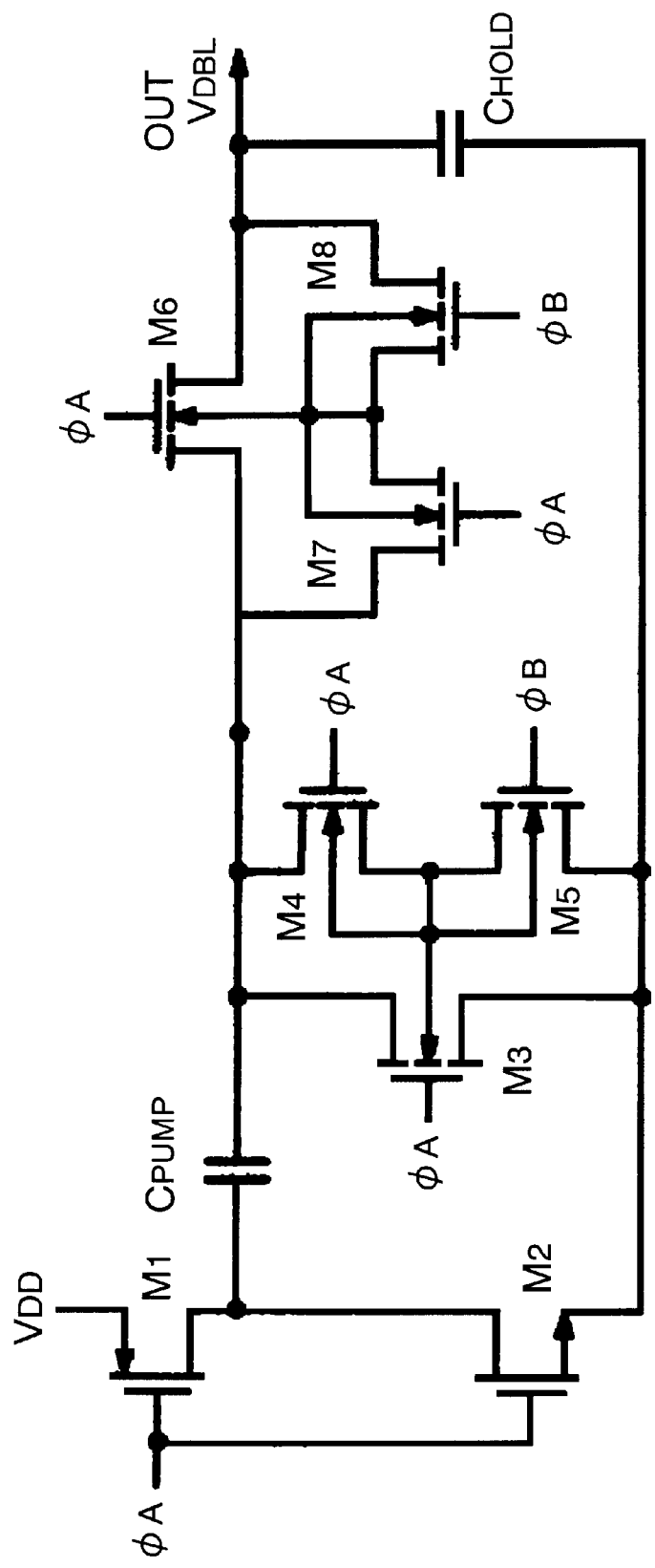
FIG. 15 is a diagram showing the structure of a charge pump circuit.

The present invention can be applied even to a case in which a charge pump circuit is employed instead of the switching regulator in the power IC that generates a negative supply voltage. An example of the charge pump circuit is shown in FIG. 15. (Document 1: Allen, P. E., and Holberg, D. R., "CMOS Analog Circuit Design, pp. 209, 1987)

The present invention is implemented by the above-described embodiments and has the advantages stated below.

Since the n-channel transistor is connected between GND and a potential lower than GND, and its gate terminal is controlled by the positive supply voltage and the invertor circuit to which the power is supplied from a potential lower than GND, GND and the potential lower than GND can be shortcircuited.

Also, since the invertor circuit is made up of one p-channel transistor, one resistor and one n-channel transistor, the circuit structure is simple and the costs can be reduced. Also, since the consumed current is only the through-current that flows through the invertor as soon as the mode is switched over, the current consumption can be suppressed to a minimum.

Also, since the resistance of the resistor used in the invertor circuit is set within a designated range, the transistor can be surely controlled.

Further, since the power IC that generates a potential lower than GND is realized by using the switching regulator, the power supply high in efficiency can be realized.

Still further, since the invertor is realized by using the comparator, the number of external parts is reduced, and the operation can be surely conducted.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A reset circuit, comprising:
   an inverter having input terminals to which a positive supply voltage and a potential lower than a ground potential are supplied for inverting a reset signal output by a power IC for indicating a standby mode of the power IC; and
   an n-channel transistor having a gate terminal connected to an output terminal of the inverter, a source terminal connected to the potential lower than ground potential and a drain terminal connected to ground potential; wherein the potential lower than ground potential is supplied from an output terminal of the power IC.

2. A reset circuit as claimed in claim 1; wherein the inverter comprises a p-channel transistor having a source terminal connected to the positive supply voltage, a resistor having one terminal connected to a drain terminal of the p-channel transistor and an n-channel transistor having a drain terminal connected to another terminal of the resistor and a source terminal connected to the potential lower than ground potential; wherein an input control signal is supplied to a gate terminal of the p-channel transistor and a gate terminal of the n-channel transistor, and an output signal is obtained from a node of the p-channel transistor and the resistor.

3. A reset circuit as claimed in claim 1; wherein a resistance R of the resistor satisfies the following expression:

$$(R+RON\_n)/(RON\_p+R+RON\_n) > (VTN-VOUT\_N)/(VDD-VOUT\_N)$$

where RON_n is an on-resistance of the n-channel transistor, RON_p is an on-resistance of the p-channel transistor, VTN is a threshold voltage of the n-channel transistor, VOUT_n is the potential lower than the ground potential, and VDD is the positive supply voltage.

4. A reset circuit as claimed in claim 1; wherein the power IC comprises an output terminal for outputting the potential lower than ground potential, a capacitor connected between ground potential and the potential lower than ground potential, a diode having one terminal connected to the potential lower than ground potential, a coil connected between another terminal of the diode and ground potential, a p-channel transistor having a drain and source connected between a node between the diode and the coil and the positive supply voltage, and a switching regulator controller which is connected to the potential lower than ground potential and compares the potential lower than ground potential with a reference voltage to control the gate terminal of the p-channel transistor.

5. A reset circuit as claimed in claim 1; further comprising a capacitor connected between ground potential and the potential lower than ground potential, a diode having one terminal connected to the potential lower than the ground potential, a coil connected between another terminal of the diode and the ground potential, a p-channel transistor having a drain and a source connected between a node between the diode and the coil and the positive supply voltage, and a switching regulator controller which is connected to the potential lower than the ground potential and compares the potential lower than ground potential with a reference voltage to control the gate terminal of the p-channel transistor.

6. A reset circuit as claimed in claim 1; wherein the inverter comprises a comparator having two input terminals and one output terminal, and a reference voltage connected to one of the input terminals of the comparator; wherein the other input of the comparator serves as an input terminal of the inverter, and the output terminal of the comparator serves as an output terminal of the inverter.

7. A reset circuit as claimed in claim 1; wherein the potential lower than ground potential comprises a negative supply voltage.

8. A reset circuit, comprising; an inverter for inverting a reset output output of an IC driven by a positive supply voltage and the negative output voltage of the IC and having input terminals for receiving the positive supply voltage and the negative output voltage of the IC; and an n-channel transistor having a gate terminal connected to an output terminal of the inverter, a source terminal connected to the negative output voltage of the IC, and a drain terminal connected to ground potential.

9. A reset circuit according to claim 8; wherein the inverter comprises a p-channel transistor having a source terminal connected to the positive supply voltage, a resistor having one terminal connected to a drain terminal of the p-channel transistor and an n-channel transistor having a drain terminal connected to an opposite terminal of the resistor and a source terminal connected to the negative output voltage of the IC; wherein an input control signal is supplied to a gate terminal of the p-channel transistor and a gate terminal of the n-channel transistor, and an output signal is obtained from a node between the p-channel transistor and the resistor.

10. A reset circuit according to claim 8; wherein a resistance R of the resistor satisfies the expression:

$$(R+RON\_n)/(RON\_p+R+RON\_n) > (VTN-VOUT\_N)/(VDD-VOUT\_N)$$

wherein RON_n is an on-resistance of the n-channel transistor, RON_p is an on-resistance of the p-channel transistor, VTN is a threshold voltage of the n-channel transistor, VOUT_n is the output of the IC, and VDD is the positive supply voltage.

11. A reset circuit according to claim 8; wherein the IC is a power source IC comprising an output terminal for providing the negative output voltage, a capacitor connected between the output terminal and ground, a diode having one terminal connected to the output terminal, a coil connected between another terminal of the diode and ground, a p-channel transistor having a drain and source connected between a node between the diode and the coil and the positive supply voltage, and a switching regulator controller connected to the output terminal for comparing the negative output voltage of the IC with a reference voltage to control the gate terminal of the p-channel transistor.

12. A reset circuit according to claim 8; further comprising a capacitor connected between the negative output voltage of the IC and ground, a diode having one terminal connected to the output of the IC, a coil connected between another terminal of the diode and ground, a p-channel transistor having a drain and a source connected between a node between the diode and the coil and the positive supply voltage, and a switching regulator controller connected to the negative output voltage of the IC for comparing the negative output voltage of the IC with a reference voltage to control the gate terminal of the p-channel transistor.

13. A reset circuit as claimed in claim 8; wherein the inverter comprises a comparator having two input terminals and one output terminal, a reference voltage connected to one of the input terminals, the other input terminal serving as an input terminal of the inverter, and the output terminal serving as an output terminal of the inverter.

* * * * *